United States Patent
Kim et al.

(10) Patent No.: US 9,691,808 B2
(45) Date of Patent: Jun. 27, 2017

(54) RADIATION DETECTOR WITH DIFFUSION STOP LAYER

(71) Applicant: Samsung Electronics Co., Ltd., Suwon-si, Gyeonggi-do (KR)

(72) Inventors: Sunil Kim, Osan-si (KR); Dongwook Lee, Suwon-si (KR); Changbum Lee, Seoul (KR); Jaechul Park, Yangju-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/798,972

(22) Filed: Jul. 14, 2015

(65) Prior Publication Data

US 2016/0043127 A1    Feb. 11, 2016

(30) Foreign Application Priority Data

Aug. 8, 2014   (KR) .................. 10-2014-0102626

(51) Int. Cl.
  *H01L 27/146*   (2006.01)

(52) U.S. Cl.
  CPC .. *H01L 27/14676* (2013.01); *H01L 27/14632* (2013.01); *H01L 27/14696* (2013.01)

(58) Field of Classification Search
  None
  See application file for complete search history.

(56) References Cited

U.S. PATENT DOCUMENTS

| | | | | |
|---|---|---|---|---|
| 2006/0262486 A1* | 11/2006 | Tadanobu | ............ | H01G 9/012 361/523 |
| 2009/0026382 A1* | 1/2009 | Sakamoto | ............ | G01T 1/2928 250/370.09 |
| 2009/0096106 A1* | 4/2009 | Vrtis | ............ | C23C 16/30 257/759 |
| 2014/0121508 A1* | 5/2014 | Latimer | ............ | A61B 5/4848 600/427 |

FOREIGN PATENT DOCUMENTS

| | | |
|---|---|---|
| JP | 3-209871 | * 9/1991 |
| JP | 2002314754 A | 10/2002 |
| JP | 4026377 B2 | 12/2007 |
| KR | 10-0483314 B1 | 4/2005 |
| KR | 10-0998313 B1 | 12/2010 |
| KR | 20110014368 A | 2/2011 |
| KR | 20120131674 A | 12/2012 |

OTHER PUBLICATIONS

Machine Translation of JP 3-209871.*

* cited by examiner

*Primary Examiner* — Yara B Green

(57) ABSTRACT

A radiation detector may include: a common electrode; a thin film transistor (TFT) array; a photoconductor material layer disposed between the common electrode and the TFT array; and a diffusion stop layer, disposed between the common electrode and the TFT array, on a location corresponding to a connecting portion where the common electrode is connected to a bias voltage supply source, wherein the diffusion stop layer prevents a metal included in the connecting portion from diffusing to the photoconductor material layer.

19 Claims, 6 Drawing Sheets

RADIATION DETECTOR WITH DIFFUSION STOP LAYER

RELATED APPLICATIONS

This application claims the benefit of Korean Patent Application No. 10-2014-0102626, filed on Aug. 8, 2014, in the Korean Intellectual Property Office, the disclosure of which is incorporated herein in its entirety by reference.

BACKGROUND

1. Field

The present disclosure relates to radiation detectors including a photoelectric conversion layer.

2. Description of the Related Art

The inside of an object may be imaged using radiation having a high transmittance such as X-rays and γ-rays. Therefore, radiation may be used for medical diagnosis and in non-destructive tests to view the contents inside of an object. The amount of radiation transmitted through an object may vary depending on a density of an object, and, therefore, the inside of the object may be imaged by measuring a difference in the transmission amount.

For example, a photoelectric conversion material (e.g., a photoconductor), may be used to detect the difference in the radiation transmission amount. When irradiating radiation on the photoconductor, electron-hole pairs are generated in the photoconductor, and the electron-hole pairs are separated into electrons and holes and converted into electric signals. According to an amount (intensity) of the radiation that reaches the photoconductor after passing through the object, an amount of electric charges generated in the photoconductor may vary, and the inside of the object is imaged by using the difference in the electric charge amount.

A voltage supply source may supply a direct current (DC) voltage to the photoconductor to form an electric field to separate the electric charges generated in the photoconductor.

However, due to various factors discussed herein, the performance of a conventional photoconductor may be reduced due to corrosion of the photoconductor and/or a leakage current varying the electric charge.

SUMMARY

Some example embodiments relate to a radiation detector capable of preventing corrosion of a photoconductor material caused by a connection portion between a voltage supply source and a common electrode or an unnecessary conductive path.

Additional aspects will be set forth in part in the description which follows and, in part, will be apparent from the description, or may be learned by practice of the presented embodiments.

According to an aspect of the inventive concept, a radiation detector includes: a common electrode; a thin film transistor (TFT) array; a photoconductor material layer disposed between the common electrode and the TFT array; and a diffusion stop layer disposed, between the common electrode and the TFT array, on a location corresponding to a connecting portion where the common electrode is connected to a bias voltage supply source, wherein the diffusion stop layer prevents a metal included in the connecting portion from diffusing to the photoconductor material layer.

The diffusion stop layer may include a non-conductive tape.

The diffusion stop layer may be disposed between the common electrode and the photoconductor material layer.

The photoconductor material layer may include one of $HgI_2$, $PbI_2$, $PbO$, $TlBr$, $CdTe$, $CdZnTe$, $CdS$, $BiI_3$, and a compound thereof.

The metal may have a melting point of 200° C. or less.

The diffusion stop layer may have a thickness of 0.1 μm to 100 μm.

The diffusion stop layer may have an area that is greater than an area of the connecting portion.

The non-conductive tape may include a silicon tape or a Teflon tape.

The diffusion stop layer may have a resistance of 1012 ohm·cm or greater.

According to an aspect of the inventive concept, a radiation detector includes: a common electrode; a thin film transistor (TFT) array; a photoconductor material layer disposed between the common electrode and the TFT array; and a diffusion stop layer, disposed between the common electrode and the TFT array, on a location corresponding to a connecting portion where the common electrode is connected to a bias voltage source, wherein the diffusion stop layer prevents leakage current occurring between the common electrode and the TFT array.

The diffusion stop layer may include a non-conductive tape.

The diffusion stop layer may be disposed between the common electrode and the photoconductor material layer.

The diffusion stop layer may be disposed between the photoconductor material layer and the TFT array.

The photoconductor material layer may include one of $HgI_2$, $PbI_2$, $PbO$, $TlBr$, $CdTe$, $CdZnTe$, $CdS$, $BiI_3$, and a compound thereof.

The connecting portion may include a conductive paste, a drying process or a curing process of which is performed at a temperature of 150° C. or less.

The conductive paste may include a conductive filler, a binder, and a solvent that is an organic solvent.

The diffusion stop layer may have a thickness of 0.1 μm to 100 μm.

The diffusion stop layer may have an area that is greater than an area of the connecting portion.

The non-conductive tape may include a silicon tape or a Teflon tape.

The diffusion stop layer may have a resistance of 1012 ohm·cm or greater.

BRIEF DESCRIPTION OF THE DRAWINGS

These and/or other aspects will become apparent and more readily appreciated from the following description of some of the example embodiments, taken in conjunction with the accompanying drawings in which.

DETAILED DESCRIPTION

Figure 1:
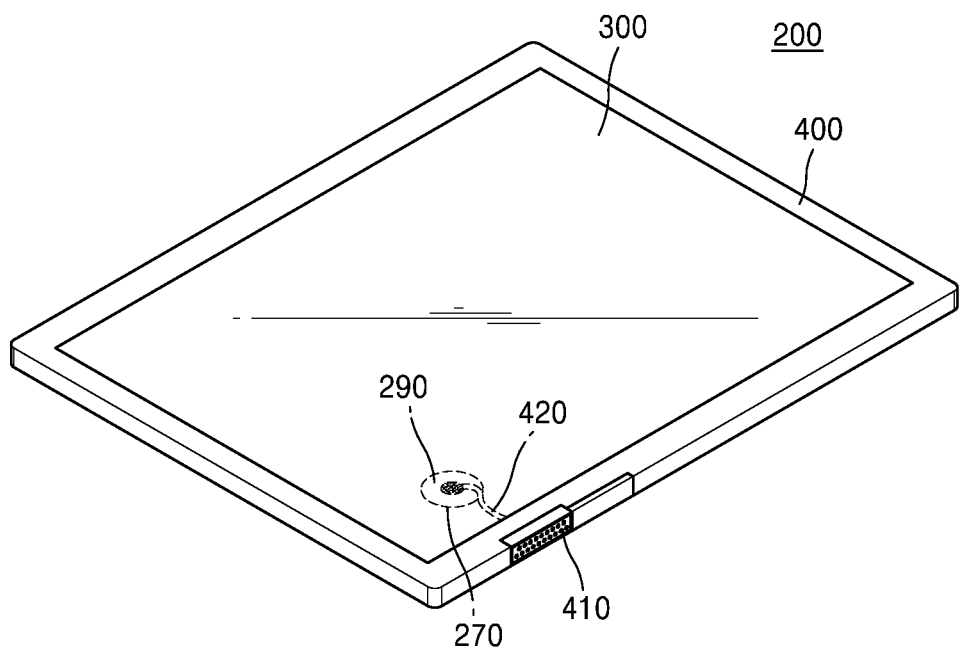
FIGS. 1 and 2 are respectively a perspective view and a cross-sectional view of a radiation detector according to some of the example embodiments.

Reference will now be made in detail to example embodiments, some examples of which are illustrated in the accompanying drawings, wherein like reference numerals refer to the like elements throughout. In the drawings, the thicknesses of layers and regions are exaggerated for clarity. Like reference numerals in the drawings denote like elements, and thus redundant descriptions thereof will not be repeated. In this disclosure below, terms such as " . . . unit", " . . . apparatus" and "module" described in the specification denote an element for performing at least one function or operation, and may be implemented in hardware, software or the combination of hardware and software.

In the present specification, "X-ray image" is an image about an object acquired by using X-rays. The object may denote a human being, an animal, or a human or animal body part. For example, the object may include an organ such as a liver, heart, brain, breast, and abdomen, or blood vessels.

Example embodiments will now be described more fully with reference to the accompanying drawings, in which some example embodiments are shown. In the drawings, the thicknesses of layers and regions are exaggerated for clarity. Like reference numerals in the drawings denote like elements.

Detailed illustrative embodiments are disclosed herein. However, specific structural and functional details disclosed herein are merely representative for purposes of describing example embodiments. Example embodiments may be embodied in many alternate forms and should not be construed as limited to only those set forth herein.

It should be understood, however, that there is no intent to limit this disclosure to the particular example embodiments disclosed. On the contrary, example embodiments are to cover all modifications, equivalents, and alternatives falling within the scope of the example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of this disclosure. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Various example embodiments will now be described more fully with reference to the accompanying drawings in which some example embodiments are shown. In the drawings, the thicknesses of layers and regions are exaggerated for clarity.

Figure 2:
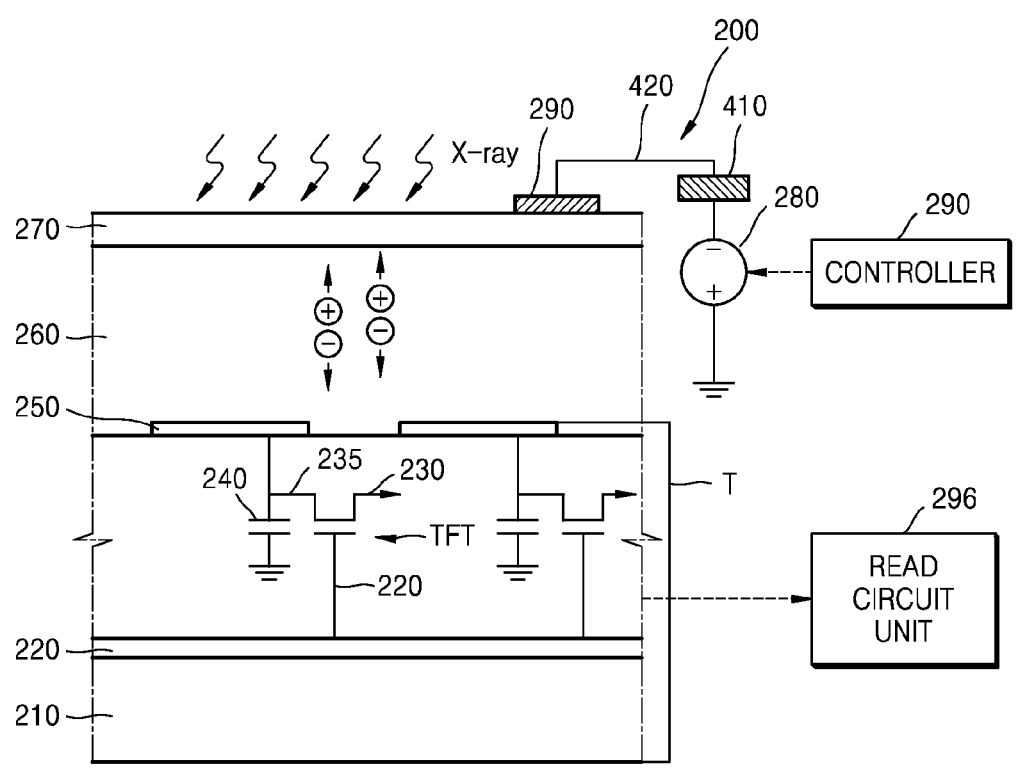

FIG. 1 is a schematic perspective view of a radiation detector 200 according to some example embodiments, and FIG. 2 is a cross-sectional view of the radiation detector 200 of FIG. 1.

Referring to FIG. 1, the radiation detector 200 is a detecting medium that is sensitive to an X-ray, and includes a sensing unit 300 in which a two-dimensional (2D) sensor is disposed, and a sensing unit case 400 accommodating the sensing unit 300. The sensing unit 300 is disposed to face an X-ray generator (not shown), and obtains micro-electric signals generated by the 2D sensor through a 2D matrix when an X-ray irradiated from the X-ray generator is applied thereto. The micro-electric signal obtained through the 2D matrix is converted into a digital value to configure image data, and the image data is displayed on a monitor or a printer after undergoing an appropriate image treatment process.

The sensing unit case 400 is a receiving member for receiving the sensing unit 300, and may have sizes of, for example, 8×10 inches, 10×12 inches, 14×14 inches, 14×17 inches, and 17×17 inches according to a size of the sensing unit 300. An electric power terminal unit 410 that may receive electric power from a bias voltage source 280 (see FIG. 2) may be disposed in the sensing unit case 400. The electric power terminal unit 410 is connected to a connecting portion 290 that is disposed on a common electrode 270 via a lead wire 420 so as to transfer a bias voltage to the common electrode 270.

Referring to FIG. 2, the radiation detector 200 may output electric signals by detecting x-rays emitted by an X-ray emitter (not shown) and transmitted through a target object (not shown).

The radiation detector 200 may include a photoconductor material layer 260 for sensing radiation, the common electrode 270 to which a voltage is applied in order to form an electric field in the photoconductor material layer 260, and a pixel electrode 250 for collecting electric charges formed in the photoconductor material layer 260.

The radiation detector 200 may further include a charging capacitor 240, in which the electric charges collected by the pixel electrode 250 are stored. The charging capacitor 240 may be connected to a drain 235 of a thin film transistor (TFT) performing as a switch of the charging capacitor 240.

The TFT may be configured to selectively provide the charges stored in the charging capacitor 240 to a data line (not shown) connected to a source 230 of the TFT based on a voltage applied to a gate of the TFT via a gate line 220. The TFT may be formed on a substrate 210 on which gate lines 220 are formed.

The photoconductor material layer 260 may be formed of various kinds of photoconductor materials that generate electric charges by sensing the X-ray, for example, CdTe, CdZnTe, $PbI_2$, TlBr, and $HgI_2$. However, example embodiments are not limited thereto, and he photoconductor layer 260 may be formed of other materials which are sensitive to x-rays and have a relatively low bias voltage.

The bias voltage source 280 is connected to the common electrode 270 to apply a voltage to the common electrode 270 so as to form an electric field in the photoconductor material layer 260. The voltage applied to the common electrode 270 may vary depending on the material forming the photoconductor material layer 260. For example, if the photoconductor material layer 260 is formed of amorphous selenium, the photoconductor material layer 260 may need a voltage of a few kV to generate a sufficient electric field. In contrast, if the photoconductor material layer 260 is formed of Mercury Iodine $HgI_2$, the photoconductor material layer 260 may only need a voltage of tens to hundreds V that is relatively low, for example, a voltage of 300V or less to generate a sufficient electric field.

The radiation detector 200 may further include a controller 290 and a read circuit unit 296. The controller 290 controls the bias voltage source 280 in order to adjust the voltage applied to the common electrode 270. For example, the controller 290 may control the bias voltage source 280 to apply one of a first voltage and a second voltage, which is different from the first voltage, to the common electrode 270.

Although not illustrated, the controller 290 and the read circuit 296 may include for example, a transmitter, a receiver, a memory, a processor that send data to and/or receive data from one another using a data bus.

The memory may be any device capable of storing data including magnetic storage, flash storage, etc. The processor may be any device capable of processing data including, for example, a microprocessor configured to carry out specific operations by performing arithmetical, logical, and input/output operations based on input data, or capable of executing instructions included in computer readable code stored in the memory. The processor may be a logic chip, for example, a central processing unit (CPU), a controller, or an application-specific integrated circuit (ASIC), that when, executing the instructions stored in the memory, configures the processor as a special purpose machine. For example, the instructions may configure the processor to control the bias voltage source 280 such that the bias voltage source 280 applies one of the first voltage and the second voltage.

When an X-ray is irradiated onto a target object, the X-ray may be transmitted through the target object and incident to the photoconductor material layer 260. The X-ray incident to the photoconductor material layer 260 generates electron-hole pairs in the photoconductor material layer 260. When the bias voltage source 280 applies a voltage to the common electrode 270 to form an electric field in the photoconductor material layer 260, the electron-hole pairs are separated by the electric field. For example, when a negative voltage is applied to the common electrode 270, holes move toward the common electrode 270 and electrons are charged in the charging capacitor 240 via the pixel electrode 250.

The TFT performs as a switch controlling the transfer of the electric charges stored in the charging capacitor 240 to the outside via the data line connected to the source electrode 230 of the TFT. When a gate voltage is applied to the gate electrode of the TFT via the gate line 220, a channel is formed between the source electrode 230 and the drain electrode 235 of the TFT.

When the channel is formed, the electric charges stored in the charging capacitor 240 are supplied to the source electrode 230 via the drain electrode 235. The electric charges supplied to the source electrode 230 are output through the data line (not shown) connected to the source electrode 230. The date line (not shown) may be connected to the read circuit unit 296 and the readout circuit unit 296 may read the charges output thereto. The read circuit unit may receive analog data signals from the data line indicating the intensities of the irradiated X-rays, and generate a digital signal therefrom.

The bias voltage source 280 may apply the voltage to the common electrode 270 via the lead wire 420 electrically connected between the bias voltage source 280 and the connecting portion 290, where the connecting portion 290 may attach the lead wire 420 to the common electrode 270. Hereinafter, ways of connecting the common electrode 270 and the bias voltage source 280 will be described in detail. Also, for convenience of description, a region under the photoconductor material layer 260 is referred to as a TFT array (T).

Figure 3A:
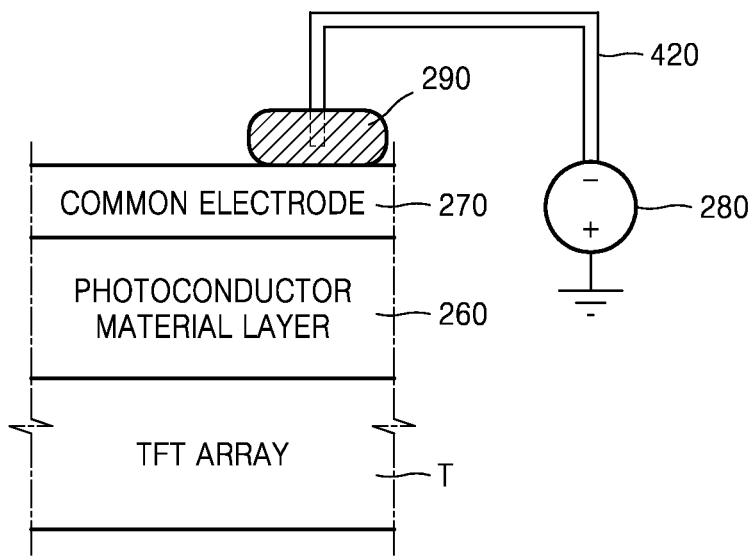
FIGS. 3A and 3B are cross-sectional views showing a connecting state between a radiation detector and a bias voltage unit.
Figure 3B:
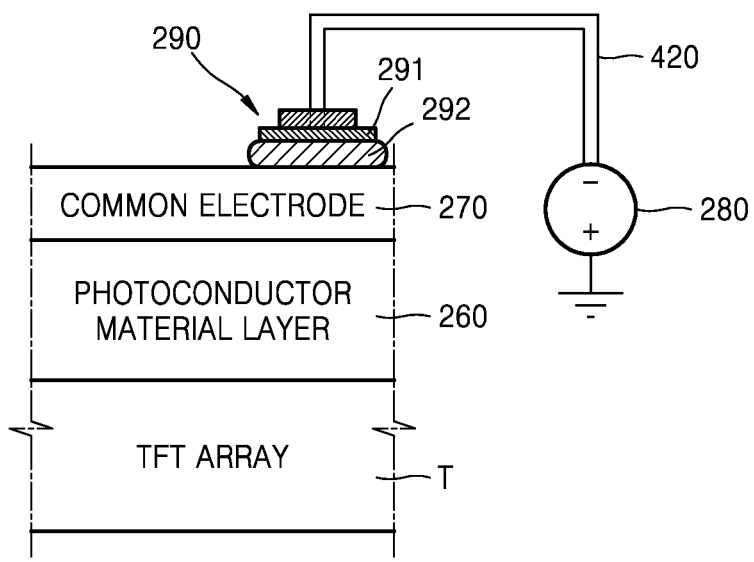

FIG. 3A is a partial cross-sectional view of the radiation detector 200 using an indium (In) bonding process to attach the lead wire 420 to the common electrode 270, and FIG. 3B is a partial cross-sectional view of the radiation detector 200 using a conductive paste to attach the lead wire 420 to the common electrode 270.

As discussed above, the bias voltage source 280 may be connected to the common electrode 270 via the lead wire 420 in order to generate the electric field in the photoconductor material layer 260. Bonding using a soldering process may be generally used to connect the lead wire 420 to the common electrode 270. However, the photoconductor material included in the photoconductor material layer 260, for example, $HgI_2$, has a low melting point of about 200° C. Then, if the lead wire 420 is bonded to the common electrode 270 through the soldering process, $HgI_2$ may be volatilized. Therefore, the bonding between the common electrode 270 and the lead wire 420 may be performed at a low temperature in an attempt to avoid evaporation of a portion of the photoconductor material layer 260.

Referring to FIG. 3A, the common electrode 270 and the lead wire 420 are connected to each other on the connecting portion 290 via a metal or metal compound having a melting point of 200° C. or less. As an example, indium In has a relatively low melting point (156° C.), and thus, the common electrode 270 and the lead wire 420 may be connected to each other through an indium In bonding process. Therefore, if the photoconductor material layer 260 is made of $HgI_2$ having the relatively higher melting point than indium In, the photoconductor material layer 260 may not be affected by the high temperature during the In bonding process between the common electrode 270 and the lead wire 420.

Figure 3C:
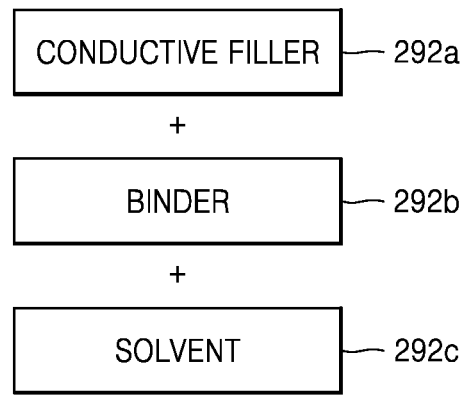
FIG. 3C is a block diagram of a conductive filler.

Referring to FIGS. 3B and 3C, the common electrode 270 and the lead wire 420 are connected to each other on the connecting portion 290 by using a conductive filler 292. The lead wire 420 is connected to a conductive plate 291 by, for example, a soldering method, and the conductive plate 291 is connected to the common electrode 292 by using the conductive filler 292. As illustrated in FIG. 3C, the conductive filler 292 may include a conductive filler 292a, a binder 292b, and a solvent 292c. The conductive filler 292a may be formed of, for example, silver (Ag), nickel (Ni), and carbon (C). The binder 292b may be formed of, for example, a synthetic resin or a material having a low melting point. The binder 292b is dissolved by the solvent 292c and mixed with the conductive filler 292a to grant an adhesive force to the conductive filler 292a. The solvent 292c dissolves the binder 292b, and makes the conductive filler 292a fluid. According to a content amount of the solvent 292c, viscosity of the conductive filler 292a may vary. The solvent 292c may be an organic solvent.

The conductive filler 292 may be classified as an evaporating dry type and a thermal curing type according to a kind of the binder 292b. The evaporating dry type conductive filler may be dried at room temperature, and may be forcedly dried at a temperature of 50° C. to 130° C. according to the solvent 292c. Also, the thermal curing type conductive filler may react with a temperature of 130° C. to 150° C. to be cured, and thus, the bonding method using the conductive filler 292 may connect the common electrode 270 and the lead wire 420 by using a low temperature process.

Figure 4:
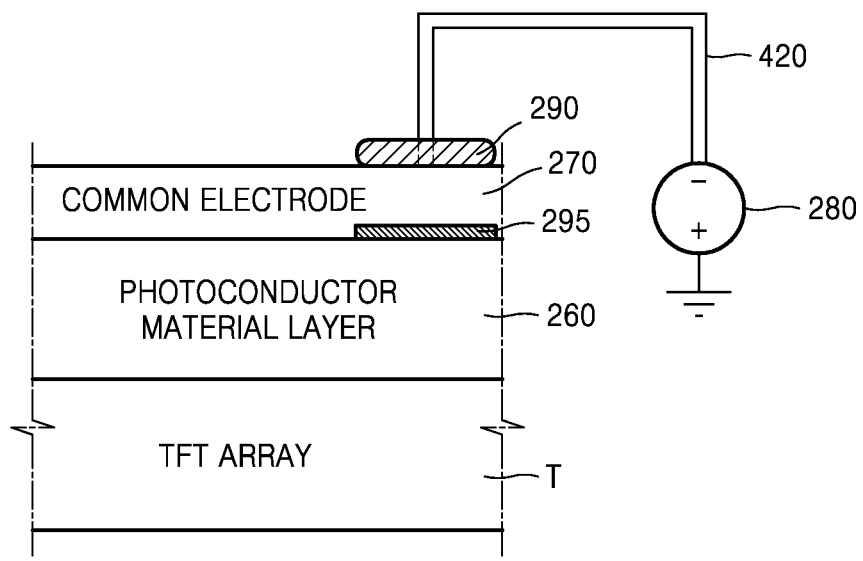
FIG. 4 is a cross-sectional view of a radiation detector according to some example embodiments.

FIG. 4 is a schematic cross-sectional view of the radiation detector 200 according to some example embodiments.

Referring to FIGS. 3A and 4, if the photoconductor material layer 260 has a very large reactivity with metal, for example, if the photoconductor material is $HgI_2$, the photoconductor material layer 260 may react with the indium In in the binding and corrode, and thus, the photoconductor material layer 260 containing $HgI_2$ may not perform as the photoconductor.

In contrast, in one or more example embodiments, a diffusion stop layer 295 is formed between the photoconductor material layer 260 and the common electrode 270 so as to block the reaction between indium In and $HgI_2$ included in the photoconductor material layer 260 in order to prevent corrosion of $HgI_2$. Therefore, $HgI_2$ may perform as the photoconductor, and the common electrode 270 and the bias voltage source 280 may be easily connected to each other.

The diffusion stop layer 295 may be formed of a non-conductive tape, for example, a silicon tape or Teflon tape. The diffusion stop layer 295 is disposed between the photoconductor material layer 260 and the common electrode 270 to correspond to the connecting portion 290 in a direction in which the common electrode 270, the photoconductor material layer 260, and the TFT array T are stacked.

The diffusion stop layer 295 may have an area that is greater than that of the connecting portion 290, and may have a resistance of 1012 ohm·cm or greater.

The diffusion stop layer 295 may be formed to a thickness of 0.1 μm to 100 μm. If the thickness of the diffusion stop layer 295 is less than 0.1 μm, a dark current increases and the diffusion stop layer 295 may not perform as the diffusion stop layer. In addition, if the thickness of the diffusion stop layer 295 is greater than 100 μm, entire series resistance may increase.

Figure 5A:
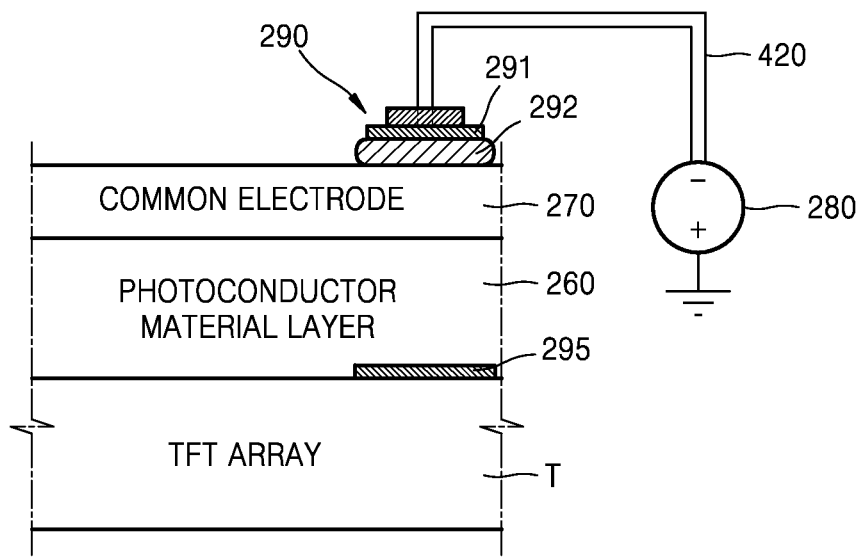
FIGS. 5A and 5B are cross-sectional views of radiation detectors according to other example embodiments.
Figure 5B:
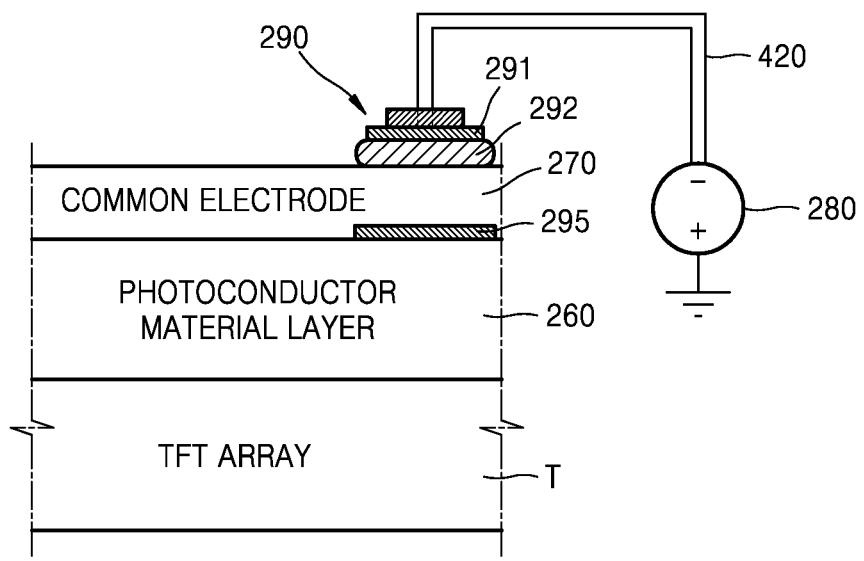

FIGS. 5A and 5B are schematic cross-sectional views of the radiation detector 200 according to other example embodiments.

If the common electrode 270 and the lead wire 420 are bonded to each other by using the conductive filler 292, the solvent 292c included in the conductive filler 292 is diffused to the photoconductor material layer 260, and then, the photoconductor material, for example, $HgI_2$, may be melted. Thus, an unnecessary conductive path may be formed between the pixel electrode 250 and the common electrode 270, thereby generating leakage current.

Referring to FIGS. 3B and 5A, the diffusion stop layer 295 is formed between the photoconductor material layer 260 and the common electrode 270 so as to prevent the solvent 292c in the conductive filler 292 from diffusing to the photoconductor material layer 260. The diffusion stop layer 295 may be formed of a non-conductive tape, and is disposed between the photoconductor material layer 260 and the common electrode 270 to correspond to the connecting portion 290 in a direction in which the common electrode 270, the photoconductor material layer 260, and the TFT array T are stacked.

Referring to FIGS. 3B and 5B, if the diffusion stop layer 295 is not used or is located below the photoconductor material layer 260, the solvent 292c in the conductive filler 292 may be diffused to the photoconductor material layer 260, and thus, the photoconductor material layer 260 may be melted and an unnecessary conductive path may be formed between the photoconductor material layer 260 and the TFT array T. Then, the leakage current may occur.

In contrast, in one or more example embodiments, the diffusion stop layer 295 may be formed between the photoconductor material layer 260 and the TFT array T so as to block the generation of the unnecessary conductive path, and, therefore, the leakage current is prevented. The diffusion stop layer 295 may be formed of a non-conductive tape, and may be disposed between the photoconductor material layer 260 and the common electrode 270 to correspond to the connecting portion 290 in a direction in which the common electrode 270, the photoconductor material layer 260, and the TFT array T are stacked.

Accordingly, the leakage current that may occur between the common electrode 270 and the TFT array T may be prevented, and the common electrode 270 and the bias voltage source 280 may be easily connected to each other.

Detailed features of the diffusion stop layer 295 are similar to those of the previous embodiment, and thus, descriptions thereof are omitted here.

Figure 6:
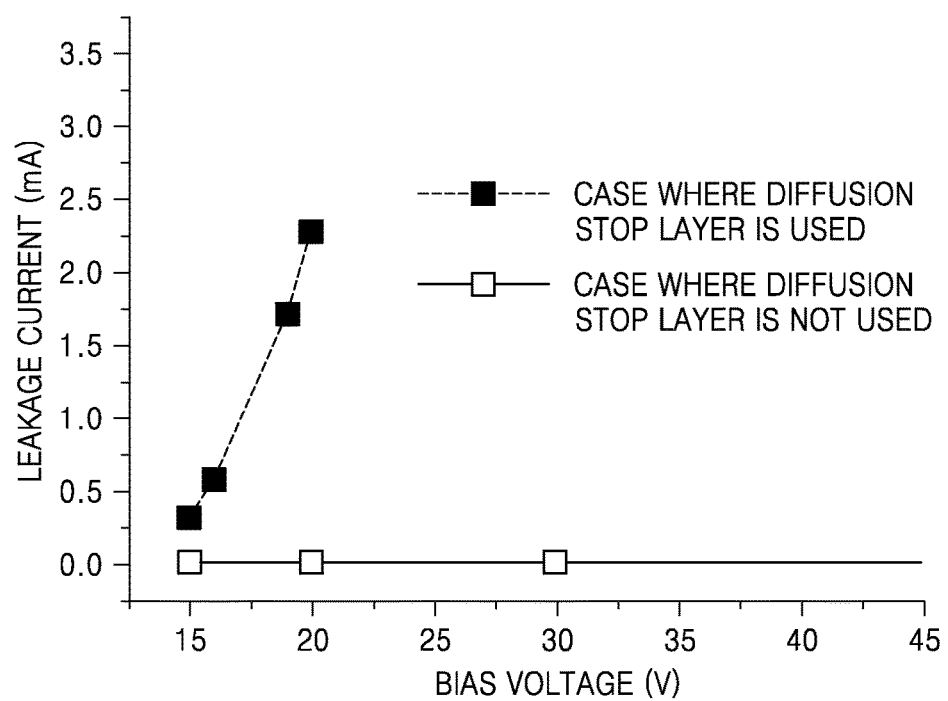
FIG. 6 is a graph showing a variation in a leakage current according to application of a bias voltage.

FIG. 6 is a graph showing no leakage current occurring in the radiation detector 200 of FIGS. 5A and 5B.

Referring to FIG. 6, if the diffusion stop layer 295 is not disposed in the radiation detector 200, an unnecessary conductive path may be formed between the common electrode 270 and the TFT array T, and thus, the leakage current may occur. As illustrated in FIG. 6, as the voltage applied to the common electrode 270 by the bias voltage source 280 increases, a magnitude of the leakage current also increases.

However, as discussed above, in one or more example embodiments, the diffusion stop layer 295 is disposed in the radiation detector 200. Therefore, the diffusion stop layer 295 may prevent the formation of the unnecessary conductive path between the common electrode 270 and the TFT array T, and the leakage current may not occur. Also, the leakage current may be prevented without regard to the magnitude of the voltage applied to the common electrode 270 by the bias voltage source 280. According to the graph of FIG. 6, the leakage current between the common electrode 270 and the TFT array T may be prevented by the diffusion stop layer 295.

According to the one or more example embodiments, the non-conductive tape is disposed on a location corresponding to the connecting portion between the voltage supply source and the common electrode so as to prevent the corrosion of the photoconductor material and/or generation of the unnecessary conductive path, and the voltage supply source and the common electrode may be easily connected electrically to each other.

While some example embodiments have been described with reference to the figures, it will be understood by those of ordinary skill in the art that various changes in form and details may be made therein without departing from the spirit and scope of the example embodiments as defined by the following claims. Accordingly, the true technical scope of the example embodiments is defined by the technical spirit of the appended claims.

The use of the terms "a" and "an" and "the" and similar referents in the context of describing the example embodiments (especially in the context of the following claims) are to be construed to cover both the singular and the plural. Furthermore, recitation of ranges of values herein are merely intended to serve as a shorthand method of referring individually to each separate value falling within the range, unless otherwise indicated herein, and each separate value is incorporated into the specification as if it were individually recited herein. Finally, the steps of all methods described herein can be performed in any suitable order unless otherwise indicated herein or otherwise clearly contradicted by context. The use of any and all examples, or exemplary language (e.g., "such as") provided herein, is intended merely to better illuminate the example embodiments and does not pose a limitation on the scope of the example embodiments unless otherwise claimed. Numerous modifications and adaptations will be readily apparent to those of ordinary skill in this art without departing from the spirit and scope of the example embodiments.

What is claimed is:

1. A radiation detector comprising:
    a common electrode including a connecting portion configured to connect the common electrode and a bias voltage source;
    a thin film transistor (TFT) array;
    a photoconductor material layer between the common electrode and the TFT array; and
    a diffusion stop layer between the common electrode and the TFT array, in a location corresponding to the connecting portion, the diffusion stop layer configured to prevent a metal included in the connecting portion from diffusing to the photoconductor material layer.

2. The radiation detector of claim 1, wherein the diffusion stop layer comprises:
    a non-conductive tape.

3. The radiation detector of claim 2, wherein the non-conductive tape comprises:
    one of a silicon tape or a Teflon tape.

4. The radiation detector of claim 1, wherein
    the TFT array is below the photoconductor material layer and the diffusion stop layer is above the photoconductor material layer such that the diffusion stop layer is between the common electrode and the photoconductor material layer.

5. The radiation detector of claim 1, wherein the photoconductor material layer comprises:
    a photoconductor material, the photoconductor material being one of HgI2, PbI2, PbO, TlBr, CdTe, CdZnTe, CdS, BiI3, or a compound thereof.

6. The radiation detector of claim 1, wherein the metal included in the connecting portion has a melting point of 200° C. or less.

7. The radiation detector of claim 1, wherein the diffusion stop layer has a thickness of 0.1 µm to 100 µm.

8. The radiation detector of claim 1, wherein the diffusion stop layer has an area that is greater than an area of the connecting portion.

9. The radiation detector of claim 1, wherein the diffusion stop layer has a resistance of 1012 ohm·cm or greater.

10. A radiation detector comprising:
    a common electrode including a connecting portion configured to connect the common electrode and a bias voltage source;
    a thin film transistor (TFT) array;
    a photoconductor material layer between the common electrode and the TFT array; and
    a diffusion stop layer comprising a non-conductive tape, the diffusion stop layer is between the common electrode and the TFT array, in a location corresponding to the connecting portion, the diffusion stop layer configured to prevent a leakage current between the common electrode and the TFT array.

11. The radiation detector of claim 10, wherein the TFT array is below the photoconductor material layer and the diffusion stop layer is above the photoconductor material layer such that the diffusion stop layer is between the common electrode and the photoconductor material layer.

12. The radiation detector of claim 10, wherein the TFT array and the diffusion stop layer are below the photoconductor material layer such that the diffusion stop layer is disposed between the photoconductor material layer and the TFT array.

13. The radiation detector of claim 10, wherein the photoconductor material layer comprises:
    a photoconductor material, the photoconductor material being one of HgI2, PbI2, PbO, TlBr, CdTe, CdZnTe, CdS, BiI3, or a compound thereof.

14. The radiation detector of claim 10, wherein the connecting portion is configured to connect the common electrode and a bias voltage source via a lead wire, and the connecting portion comprises:
    a conductive paste bonding the connecting portion to the lead wire via a drying process or a curing process performed at a temperature of 150° C. or less.

15. The radiation detector of claim 14, wherein the conductive paste comprises:
    a conductive filler, a binder, and a solvent that is an organic solvent.

16. The radiation detector of claim 10, wherein the diffusion stop layer has a thickness of 0.1 µm to 100 µm.

17. The radiation detector of claim 10, wherein the diffusion stop layer has an area that is greater than an area of the connecting portion.

18. The radiation detector of claim 10, wherein the non-conductive tape comprises:
    a silicon tape or a Teflon tape.

19. The radiation detector of claim 10, wherein the diffusion stop layer has a resistance of 1012 ohm·cm or greater.

* * * * *